(12) United States Patent
Lee et al.

(10) Patent No.: US 12,218,295 B2
(45) Date of Patent: Feb. 4, 2025

(54) MICRO LED DISPLAY AND MANUFACTURING METHOD THEREFOR

(71) Applicants: Samsung Electronics Co., Ltd., Suwon-si (KR); RESEARCH & BUSINESS FOUNDATION SUNGKYUNKWAN UNIVERSITY, Suwon-si (KR)

(72) Inventors: Byunghoon Lee, Suwon-si (KR); Taeil Kim, Suwon-si (KR); Jamyeong Koo, Suwon-si (KR); Juseung Lee, Suwon-si (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 370 days.

(21) Appl. No.: 17/456,838

(22) Filed: Nov. 29, 2021

(65) Prior Publication Data
US 2022/0085265 A1 Mar. 17, 2022

Related U.S. Application Data

(63) Continuation of application No. PCT/KR2020/006796, filed on May 26, 2020.

(30) Foreign Application Priority Data

May 29, 2019 (KR) ........................ 10-2019-0063285

(51) Int. Cl.
*H01L 33/62* (2010.01)
*H01L 23/00* (2006.01)
*H01L 25/16* (2023.01)

(52) U.S. Cl.
CPC .............. *H01L 33/62* (2013.01); *H01L 24/05* (2013.01); *H01L 24/29* (2013.01); *H01L 24/32* (2013.01);
(Continued)

(58) Field of Classification Search
CPC ..... H01L 24/81; H01L 24/32; H01L 25/0753; H01L 24/83; H01L 24/29; H01L 24/05;
(Continued)

(56) References Cited

U.S. PATENT DOCUMENTS 5,773,896 A * 6/1998 Fujimoto ............ H01L 23/3135
257/E21.705
6,350,338 B1 * 2/2002 Comiskey ................. B44C 1/16
156/247

(Continued)

FOREIGN PATENT DOCUMENTS

JP       2002271005 A    9/2002
KR  10-2013-0109743 A   10/2013

(Continued)

OTHER PUBLICATIONS

International Search Report and Written Opinion of the International Searching Authority in connection with International Application No. PCT/KR2020/006796 issued Sep. 11, 2020, 12 pages.

(Continued)

*Primary Examiner* — Mouloucoulaye Inoussa

(57) ABSTRACT

Various embodiments of the disclosure disclose a method for manufacturing a micro Light Emitting Diode (LED) display. The disclosed manufacturing method may include coating a face of a substrate including a circuit portion with a first thickness of a polymer adhesive solution containing a plurality of metal particles, attaching an array of micro LED chips on the polymer adhesive solution, physically connecting a connection pad for each of the array of micro LED (Continued)

chips to the metal particles through heating and pressing the attached plurality of micro LED chips to descend through the polymer adhesive solution, and chemically bonding the metal particles to the connection pad and the circuit portion through heating and pressing so that the micro LED chips are electrically connected to the circuit portion. Various other embodiments are also possible.

14 Claims, 18 Drawing Sheets

(52) U.S. Cl.
CPC ............ *H01L 24/83* (2013.01); *H01L 25/167* (2013.01); *H01L 24/04* (2013.01); *H01L 24/08* (2013.01); *H01L 24/92* (2013.01); *H01L 2224/04026* (2013.01); *H01L 2224/05557* (2013.01); *H01L 2224/05573* (2013.01); *H01L 2224/05609* (2013.01); *H01L 2224/05644* (2013.01); *H01L 2224/08148* (2013.01); *H01L 2224/29201* (2013.01); *H01L 2224/2939* (2013.01); *H01L 2224/32146* (2013.01); *H01L 2224/8034* (2013.01); *H01L 2224/80895* (2013.01); *H01L 2224/83191* (2013.01); *H01L 2224/83801* (2013.01); *H01L 2224/83874* (2013.01); *H01L 2224/83906* (2013.01); *H01L 2224/92142* (2013.01); *H01L 2224/9221* (2013.01); *H01L 2933/0066* (2013.01)

(58) Field of Classification Search
CPC ....... H01L 25/167; H01L 27/12; H01L 33/62; H01L 24/14; H01L 24/16; H01L 24/04; H01L 24/73; H01L 27/156; H01L 24/30; H01L 24/27; H01L 25/50; H01L 2224/83862; H01L 2224/8034; H01L 2224/92142; H01L 2224/05557; H01L 2224/29201; H01L 2224/83191; H01L 2224/83906; H01L 2224/05573; H01L 2224/04026; H01L 2224/83097; H01L 2224/32225; H01L 2224/81101; H01L 2933/0066; H01L 2224/05644; H01L 2224/81895; H01L 2224/83201; H01L 2224/83075; H01L 2224/08148; H01L 2224/83801; H01L 2224/83874; H01L 2224/2939; H01L 2224/73204; H01L 2224/16225; H01L 2224/29021; H01L 2224/29164; H01L 2224/29144; H01L 2224/29155; H01L 2924/12041; H01L 2224/32147; H01L 2224/2919; H01L 2224/29028; H01L 2224/16146; H01L 2224/17181; H01L 2224/2957; H01L 2225/06565; H01L 2224/29013; H01L 2224/94; H01L 2225/06517; H01L 2225/06568; H01L 2224/2929; H01L 2225/0651; H01L 2924/15311; G09F 9/33; C09J 179/08; C09J 5/02; C09J 5/06; C09J 179/085; G03F 7/322; G03F 7/085; G03F 7/037; G03F 7/162; G03F 7/031; G03F 7/20; G03F 7/033; G03F 7/027; G03F 7/032; C08G 73/106; C08G 73/128
USPC ............ 257/89, 98, 621, 706, 707, E33.067, 257/E33.072, E21.505, E23.169; 438/27, 438/343, 323, 109; 361/749, 768; 156/64; 428/212
See application file for complete search history.

(56) References Cited

U.S. PATENT DOCUMENTS

| | | | | |
|---|---|---|---|---|
| 9,508,680 B1* | 11/2016 | Ayotte | ...................... | C09K 5/06 |
| 11,842,982 B2* | 12/2023 | Lee | ...................... | H01L 25/0652 |
| 2003/0178132 A1* | 9/2003 | Shinozaki | ............... | H05K 3/323 |
| | | | | 257/E21.514 |
| 2005/0155706 A1* | 7/2005 | Nishida | ................. | H01L 21/563 |
| | | | | 257/E21.511 |
| 2007/0278666 A1* | 12/2007 | Garcia | ................. | H01L 23/4334 |
| | | | | 257/E23.105 |
| 2008/0196245 A1* | 8/2008 | Nishimura | ............... | H01L 24/29 |
| | | | | 156/256 |
| 2009/0008765 A1* | 1/2009 | Yamano | ................. | H01L 25/16 |
| | | | | 257/E23.125 |
| 2011/0157853 A1* | 6/2011 | Goh | ...................... | H01L 23/293 |
| | | | | 361/783 |
| 2011/0237028 A1* | 9/2011 | Hamazaki | ............... | H01L 24/81 |
| | | | | 438/108 |
| 2011/0266578 A1* | 11/2011 | Kanisawa | ................ | C09J 11/04 |
| | | | | 428/323 |
| 2011/0291143 A1* | 12/2011 | Kim | ...................... | H01L 33/60 |
| | | | | 438/27 |
| 2011/0315956 A1* | 12/2011 | Tischler | ................. | H01L 33/36 |
| | | | | 257/E33.048 |
| 2012/0112220 A1* | 5/2012 | West | ....................... | H01L 33/62 |
| | | | | 257/E33.072 |
| 2012/0168213 A1* | 7/2012 | Park | ........................ | C08J 5/18 |
| | | | | 174/257 |
| 2013/0049054 A1* | 2/2013 | Namiki | ................... | C08K 3/08 |
| | | | | 257/E33.072 |
| 2013/0056749 A1* | 3/2013 | Tischler | ................. | H05K 13/00 |
| | | | | 257/E33.072 |
| 2013/0082399 A1* | 4/2013 | Kim | ........................ | H01L 24/81 |
| | | | | 257/E23.145 |
| 2014/0217450 A1* | 8/2014 | Ishigami | .................... | C09J 9/00 |
| | | | | 252/514 |
| 2014/0312511 A1* | 10/2014 | Nakamura | ............... | H01L 24/81 |
| | | | | 438/109 |
| 2014/0346684 A1* | 11/2014 | Kojima | ................... | H01L 24/32 |
| | | | | 438/118 |
| 2015/0069435 A1* | 3/2015 | Chen | ........................ | H01L 33/56 |
| | | | | 438/27 |
| 2015/0102485 A1* | 4/2015 | Kang | ....................... | H01L 24/32 |
| | | | | 524/439 |
| 2015/0140738 A1* | 5/2015 | Moriyama | .............. | H01L 24/83 |
| | | | | 403/272 |
| 2015/0162265 A1* | 6/2015 | Jo | ........................... | H01L 25/50 |
| | | | | 257/774 |
| 2015/0171297 A1 | 6/2015 | Rhee et al. | | |
| 2015/0197672 A1* | 7/2015 | Namiki | ..................... | C09J 11/00 |
| | | | | 252/74 |
| 2015/0347806 A1* | 12/2015 | Li | ........................... | G06V 40/13 |
| | | | | 438/48 |
| 2016/0093580 A1* | 3/2016 | Scanlan | .................. | H01L 24/02 |
| | | | | 438/114 |
| 2016/0194531 A1* | 7/2016 | Aoki | ....................... | C09J 133/20 |
| | | | | 525/107 |
| 2017/0179062 A1* | 6/2017 | Jang | ........................ | H01L 21/563 |
| 2017/0243857 A1* | 8/2017 | Hwang | ................... | H01L 24/92 |
| 2017/0271299 A1* | 9/2017 | Li | ............................ | H01L 24/83 |
| 2018/0012866 A1* | 1/2018 | Choi | .................... | H01L 25/0657 |
| 2018/0019234 A1* | 1/2018 | Hu | ............................ | H01L 24/92 |
| 2018/0053751 A1* | 2/2018 | Zou | ....................... | H01L 33/0093 |
| 2018/0190225 A1 | 7/2018 | Chen | | |
| 2018/0273809 A1 | 9/2018 | Lin et al. | | |
| 2018/0312731 A1* | 11/2018 | Honda | .................... | H01L 24/10 |
| 2019/0002741 A1 | 1/2019 | Ozeki | | |
| 2019/0096856 A1* | 3/2019 | Hwang | ................... | H01L 25/50 |
| 2019/0265327 A1* | 8/2019 | Bennison | ................ | G01S 7/4817 |
| 2020/0058838 A1 | 2/2020 | Choi et al. | | |
| 2020/0077523 A1* | 3/2020 | Kim | ...................... | C09J 201/00 |
| 2020/0219853 A1* | 7/2020 | Hwang | ................. | H01L 25/105 |
| 2020/0357950 A1* | 11/2020 | Takagi | .................... | H01L 33/24 |
| 2020/0413559 A1* | 12/2020 | Lee | ......................... | H05K 1/189 |
| 2021/0050498 A1* | 2/2021 | Lee | ........................... | H01L 24/29 |

(56) References Cited

U.S. PATENT DOCUMENTS

| | | | |
|---|---|---|---|
| 2021/0066148 A1* | 3/2021 | Kim | H01L 23/562 |
| 2021/0066243 A1* | 3/2021 | Lee | H01L 21/6835 |
| 2021/0217804 A1* | 7/2021 | Takagi | H01L 27/156 |
| 2021/0265327 A1* | 8/2021 | Koo | H01L 25/13 |
| 2021/0375833 A1* | 12/2021 | Lee | H01L 33/0095 |
| 2022/0384686 A1* | 12/2022 | Kang | H01L 33/62 |

FOREIGN PATENT DOCUMENTS

| | | |
|---|---|---|
| KR | 10-2015-0070940 A | 6/2015 |
| KR | 10-2018-0055549 A | 5/2018 |
| KR | 10-2018-0082003 A | 7/2018 |
| KR | 10-2018-0102424 A | 9/2018 |
| KR | 10-2018-0130356 A | 12/2018 |
| KR | 10-2020-0024713 A | 3/2020 |

OTHER PUBLICATIONS

Office Action issued Jan. 31, 2024, in connection with Korean Patent Application No. 10-2019-0063285, 13 pages.
Office Action issued Oct. 28, 2024, in connection with Korean Patent Application No. 10-2019-0063285, 14 pages.

\* cited by examiner

MICRO LED DISPLAY AND MANUFACTURING METHOD THEREFOR

CROSS-REFERENCE TO RELATED APPLICATIONS

This application is a continuation of International Application No. PCT/KR2020/006796, filed May 26, 2020, which claims priority to Korean Patent Application No. 10-2019-0063285, filed May 29, 2019, the disclosures of which are herein incorporated by reference in their entirety.

BACKGROUND

1. Field

Various embodiments of the disclosure relate to a micro Light Emitting Diode (LED) display and a manufacturing method thereof

2. Description of Related Art

The integration and performance improvement of various electronic elements significantly contribute to make an electronic device small in size with advanced performance. Various methods and studies are attempted to reliably connect the small and integrated electronic elements to a circuit or a substrate.

In general, metal wire bonding and flip-chip bonding methods are mainly used as a method of electrically connecting various electronic elements, such as a light emitting diode, a transistor, or the like, to a metal pad of a substrate such as a breadboard.

The metal wire bonding method is a method used when an electrode of the electronic element is located at an upper side, and aluminum or gold is used as a material of a metal wire. This is a method of directly connecting the electrode of the electronic element and the metal pad of the substrate by using equipment including a capillary tube.

In order to overcome some of the problems of the metal wire bonding method, the metal wire bonding method has recently been replaced with the flip-chip bonding method. The flip-chip bonding method is a method used when the electrode of the electronic element is located at a lower side, and a solder bump is mainly used for electrically connecting the electronic element. The flip-chip bonding method is a method in which the solder bump is patterned on the electrode of the electronic element or the metal pad of the substrate, and heat is applied thereto for an electrical connection.

Meanwhile, in addition to a consistent development direction of a display with a high-brightness, high-resolution, and large-size, there is a growing demand recently for high efficiency, low power, or the like in line with the trend of an eco-friendly electronic product. Accordingly, an Organic Light Emitting Diode (OLED) panel is in the spotlight as a new display to replace a Liquid Crystal Display (LCD) panel. However, high prices, large screen, and reliability issues due to low mass production yields remain as problems to be solved.

As a new product to replace or supplement this, there is an attempt for research on techniques for producing a display panel by directly mounting an LED which emits colors of Red (R), Green (G), and Blue (B) on a substrate.

However, in order to implement a display, a micro LED that can correspond to a current pixel shall be developed in advance, and a problem to be solved in advance includes how to pick up a micro LED chip with a size of tens of μm and how precisely place it on a substrate, and how to electrically connect it to the substrate.

SUMMARY

However, in order to implement a display, a micro Light Emitting Diode (LED), which can correspond to a current pixel shall be developed in advance, and a problem to be solved in advance includes how to pick up a micro LED chip with a size of tens of μm and how precisely place it on a substrate, and how to electrically connect the substrate to an electrode with a size of tens of μm located on the micro LED chips with the size of tends of μm.

In case of a metal wire bonding method, a usage thereof is limited due to a complex process, a low throughput, an instability of a metal wire for connecting a substrate and an element.

In order to replace this, a flip-chip bonding method using a solder bump is used but has several limitations. Although the flip-chip bonding method is a widely used method, there is a disadvantage in that a bump has to be patterned on an electrode one by one, and it is known that patterning of the bump with a size of tens of μm is difficult.

Various embodiments of the disclosure provide a micro LED display suitable for connecting a micro LED chip with a size of μm and applicable to a process for a large area with a high throughput, and a manufacturing method thereof.

Various embodiments of the disclosure provide a micro LED display capable of electrically, physically, and chemically connecting a substrate and an electronic element by using a conductive metal particle contained in a polymer having an electrically insulating property, and a manufacturing method thereof.

According to various embodiments of the disclosure, a method for manufacturing a micro Light Emitting Diode (LED) display may include a first step of coating a face of a substrate including a circuit portion with a first thickness of a polymer adhesive solution containing a plurality of metal particles, a second step of attaching an array of micro LED chips on the polymer adhesive solution, a third step of physically connecting a connection pad for each of the array of micro LED chips through heating and pressing the attached array of micro LED chips to descend through the polymer adhesive solution, and a fourth step for chemically bonding the metal particles to the connection pad and the circuit portion through heating and pressing so that the micro LED chips are electrically connected to the circuit portion.

According to various embodiments of the disclosure, a micro LED display may include a substrate including a circuit portion at one face, a polymer adhesive layer constructed with a first thickness on one face of the substrate and including a plurality of metal particles, an array of micro LED chips attached on the polymer adhesive layer, and including a first portion located in the polymer adhesive layer and a second portion located outside of the polymer adhesive layer, and a conductive structure constructed between the circuit portion and a connection pad of the micro LED chips by means of the plurality of metal particles.

According to the disclosure, an electronic element, e.g., a micro Light Emitting Diode (LED) chip, and a substrate can be easily electrically connected through a simple process of only coating, UltraViolet (UV) curing, heat-treatment of a polymer adhesive solution containing a nano-sized metal particle.

According to the disclosure, a damage on the electronic element and the substrate due to high pressure and high heat can be minimized, thereby manufacturing a display element, e.g., a micro LED display, with a high throughput.

According to the disclosure, since a manufacturing process is very simple, it can be applied to improve a process in which a display element, e.g., a micro LED display, is produced to have a large area.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
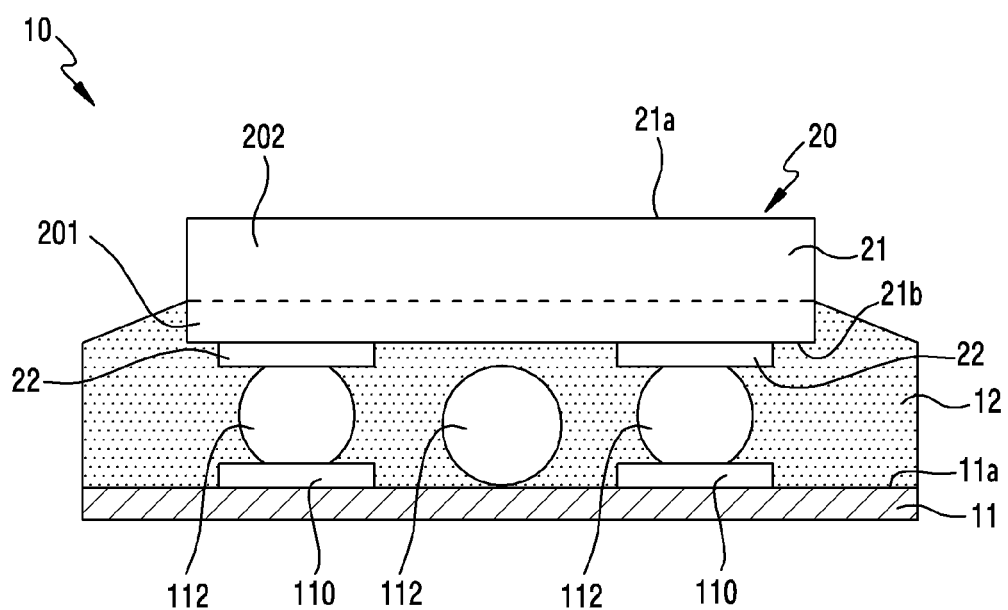
FIG. 1 is a cross-sectional view illustrating a structure of a micro Light Emitting Diode (LED) display according to various embodiments of the disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

FIG. 1 is a cross-sectional view illustrating a structure of a micro Light Emitting Diode (LED) display according to various embodiments of the disclosure.

Referring to FIG. 1, a display device 10 according to an embodiment may be a display device in which a plurality of micro LED chips 20 are plated, as a display element using a structure in which a plurality of light emitting elements are arrayed on a substrate 11. According to an embodiment, the display device 10 may include the substrate 11, a polymer adhesive layer 12, and the plurality of micro LED chips 20. Hereinafter, the display device 10 will be referred to as a micro LED display.

According to an embodiment, a plurality of light emitting elements, e.g., the micro LED chips 20, are made conductive after plating on the substrate 11 by means of the polymer adhesive layer 12 and function as a light source of the display. For example, the micro LED chip 20 has a size approximately less than or equal to 100 μm, and in general, may have a size of tens of μm. According to an embodiment, the micro LED chip 20 may include a light emitting body 21 and a connection pad 22. According to an embodiment, one face 21a of the light emitting body 21 is a face from which light is emitted, and the other face 21b may be a face to which the connection pad 22 is disposed. According to an embodiment, the plurality of micro LED chips 20 may be arrayed and attached arrayed on the polymer adhesive layer 12 in a connection pad-down state. According to an embodiment, in each of the plurality of micro LED chips 20, a first portion 201 may be located inside the polymer adhesive layer 12 on the adhesive layer 12, and a second portion 202 may be located outside the polymer adhesive layer 12. According to an embodiment, the micro LED chip 20 may be disposed such that the connection pad 22 is located inside the polymer adhesive layer 12 so as to be connected to metal particles 112.

According to an embodiment, the micro LED chip 20 may be disposed such that the first portion 201 occupies approximately less than or equal to 50%, and the second portion 202 occupies greater than or equal to 50%. According to an embodiment, since there is a need for a structure in which the connection pad 22 is located inside the polymer adhesive layer 12, the micro LED chip 20 may be disposed such that the first portion 201 occupies less than or equal to 10%, and the second portion 202 occupies greater than or equal to 90%.

According to an embodiment, the substrate 11 may be a support base for plating a plurality of electric elements, i.e., the micro LED chips 20 used as a light emitting element of a display, in an aligned state. For example, the substrate 11 may be constructed of any one of a glass material, a sapphire material, a transparent synthetic resin, and a transparent ceramic material. According to an embodiment, the substrate 11 may be constructed of a rigid material or a flexible material. According to an embodiment, the substrate 11 may have a circuit portion 110 constructed of a conductive material on one face to which the micro LED chips 20 are connected. For example, the circuit portion 110 may be a Thin Film Transistor (TFT) circuit. According to an embodiment, the circuit portion 110 may be disposed to one face of the substrate 11 in a layer shape. According to an embodiment, the circuit portion 110 may be disposed in a protruding shape or a recessed shape on one face of the substrate 11.

According to an embodiment, the polymer adhesive layer 12 may be constructed on one face of the substrate 11. According to an embodiment, the polymer adhesive layer 12 is a layer cured after coating an adhesive solution on one face 11a of the substrate 11, and may include the plurality of metal particles 112 dispersed with each other. The metal particles 112 may have a nano size approximately in the range of 50 nm to 500 nm. According to an embodiment, the metal particles 112 may be disposed inside the polymer adhesive layer 12 in a uniform or non-uniform state. According to an embodiment, at least one or more of the metal particles 112 may have a conductive structure for electrically connecting the connection pad 22 of the micro LED chip and the circuit portion 110 of the substrate 11. For example, the metal particle 112 may have a size in the range of 50 nm to 500 nm. According to an embodiment, the polymer adhesive layer 12 coated on the substrate 11 may be coated with a thickness in the range of 100 nm to 1000 nm.

According to an embodiment, the polymer adhesive layer 12 may be a support structure for supporting each of the arrayed micro LED chips 20, and since the plurality of metal particles 112 are included, may be part of a conductive structure for electrically connecting the micro LED chip 20 to the circuit portion 110 of the substrate 11.

According to an embodiment, the micro LED display 10 may have a conductive structure of the micro LED chip 20 due to a connection structure between the connection pad 22 of the micro LED chip 20, the plurality of metal particles 112, and the circuit portion 110 of the substrate 11.

Figure 2:
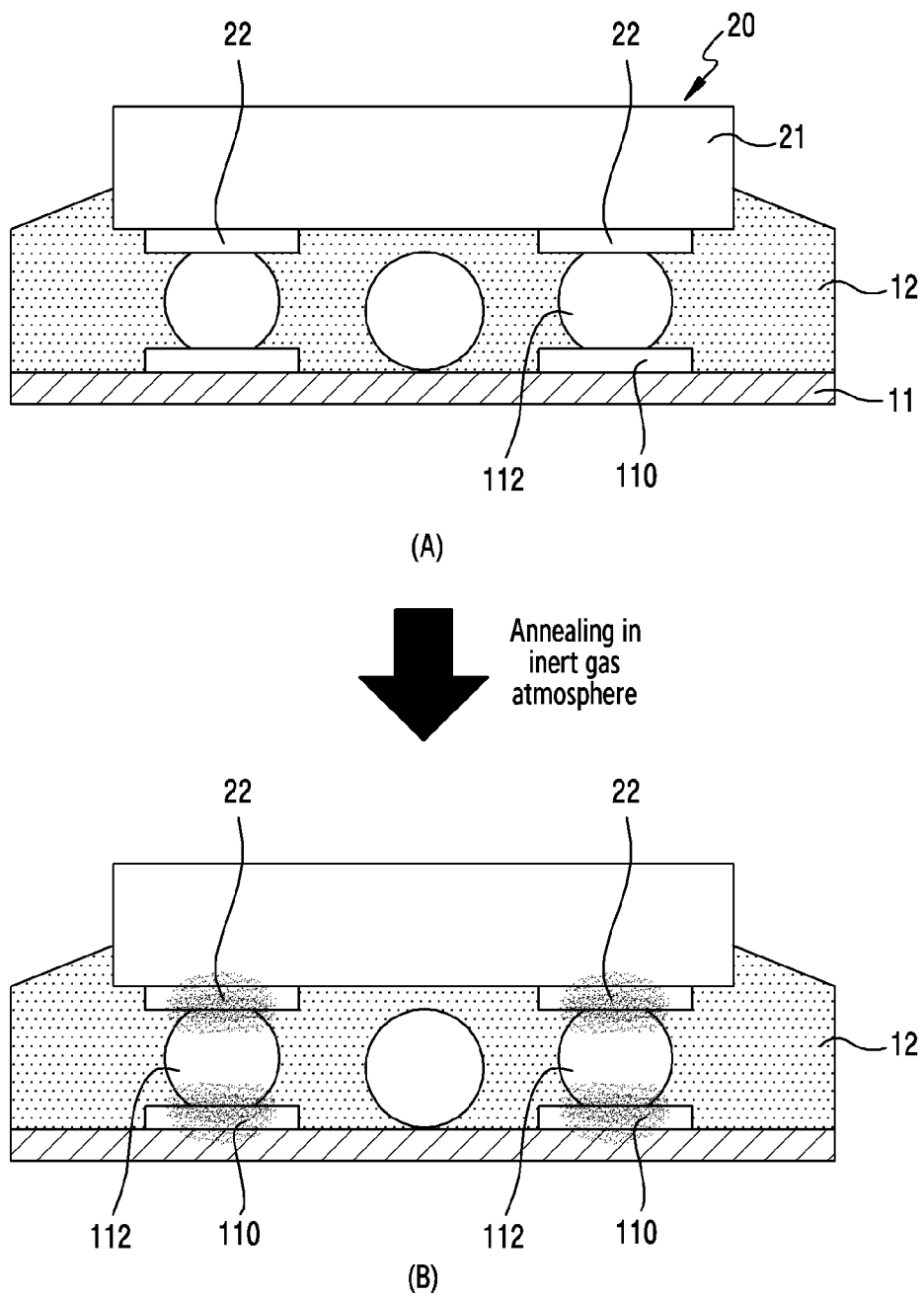
FIG. 2 is a cross-sectional view illustrating an annealing process of a micro LED display according to various embodiments of the disclosure.

FIG. 2 is a cross-sectional view illustrating an annealing process of a micro LED display according to various embodiments of the disclosure.

Referring to FIG. 2, according to an embodiment, a micro LED chip 20 arrayed on a polymer adhesive layer 12 may be subjected to a heating and pressing process to construct a conductive structure between a substrate 11 and a connection pad 22 of the micro LED chip 20. According to an embodiment, as shown in FIG. 2(a), the plurality of micro LED chips 20 plated on the polymer adhesive layer 12 physically bonded may be subjected to the heating and processing process through a chemical reaction to construct a conductive structure between a circuit portion 110 of the substrate 11 and the connection pad 22 of the micro LED chip 20.

According to an embodiment, the polymer adhesive layer 12 including a metal particle 112 disposed on the substrate 11 may be subjected to the heating or pressing process to form a physical bond, i.e., a conductive structure, between the metal particle 112 and the connection pad 22 of the micro LED chip 20. In addition, the physical bond, i.e., the conductive structure, may be formed between the metal particle 112 and the circuit portion 110 of the substrate 11. The conductive structure may be constructed between the connection pad 22 of the micro LED chip 20 and the metal particle 112 and the circuit portion 110 of the substrate 11 due to the physical bond formed around the metal particle 112. According to such a process, the plurality of micro LED chips 20 may be bonded on the substrate 11.

According to an embodiment, a micro LED display may be cooled after a chemical bond is achieved through an annealing process in an atmosphere state or an inert gas environment. After the annealing process, the conductive structure of the micro LED chip 20 for which the chemical bond is achieved is cured. Through the metal particle 112, the connection pad 22 may be electrically connected to the circuit board 110 more reliably and stably than before the annealing process.

FIG. 3A to FIG. 3D are cross-sectional views sequentially illustrating a manufacturing process of a micro LED display according to various embodiments of the disclosure.

A method of manufacturing a micro LED display according to an embodiment will be described below with reference to FIG. 3A to FIG. 3D.

Figure 3A:
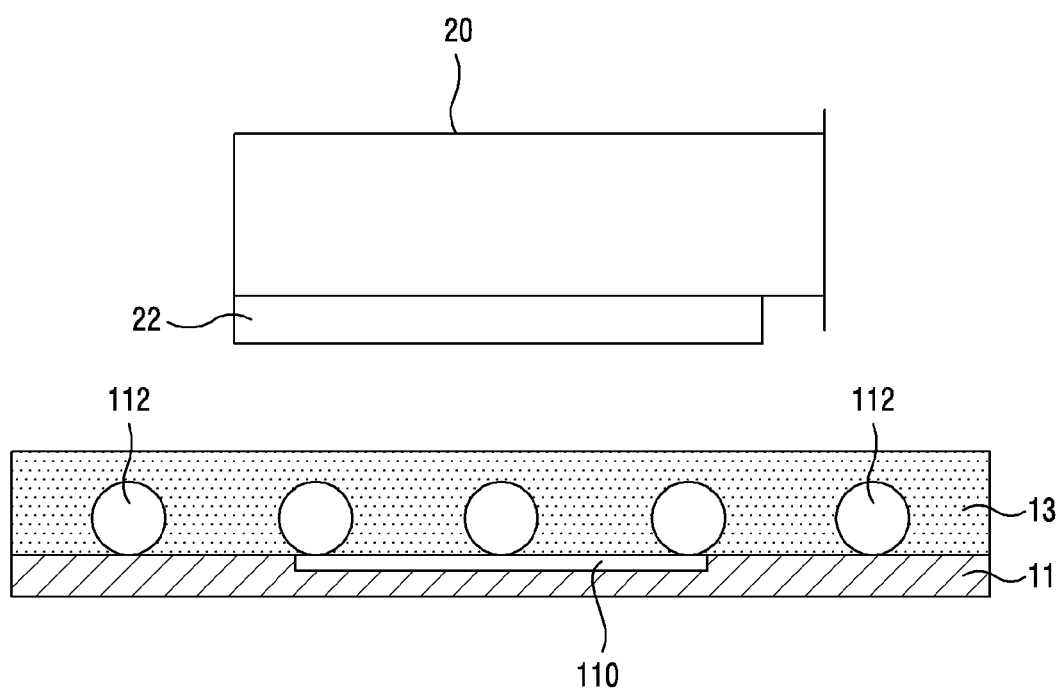
FIGS. 3A to 3D are cross-sectional views sequentially illustrating a manufacturing process of a micro LED display according to various embodiments of the disclosure.

Referring to FIG. 3A, a polymer adhesive solution 13 in which a metal particle 112 is dispersed on a prepared substrate 11 may be coated with a first thickness. For example, the first thickness may be a sufficiently thin thickness. According to an embodiment, the first thickness of the polymer adhesive solution 13 may be in the range of 100 nm to 1000 m. According to an embodiment, in a coating method of the polymer adhesive solution 13, large-area coating may use a spin coating method due to a low viscosity of the adhesive solution 13, and local coating may use a printing or jetting method. For example, the polymer adhesive solution 13 may have an adhesive strength of at least 1 Mn/m2. According to an embodiment, the polymer adhesive solution 13 may contain a UV curing agent. When UV rays are irradiated to the polymer adhesive solution 13, the adhesive strength of the irradiated portion may be removed.

According to an embodiment, the plurality of metal particles 112 contained in the polymer adhesive solution 13 coated on the substrates 11 and 10 are arrayed uniformly or non-uniformly, and may be arrayed on a circuit portion 110 of the substrates 11 and 10. According to an embodiment, the plurality of metal particles 112 contained in the polymer adhesive solution 13 may have a nano size, for example, in the range of 50 nm to 500 nm. According to an embodiment, the metal particles 112 contained in the polymer adhesive solution 13 are alloyed with metal materials in the circuit portion 110 of the substrates 11 and 10 at a temperature in the range of 50° C. to 300° C., or may have a melting point at a temperature equal to or lower than that.

A plurality of micro-sized electronic elements, such as a plurality of micro LED chips 20, prepared on the substrates 11 and 10 coated with the polymer adhesive solution 13 may be prepared at a desired position. According to an embodiment, in each of the micro LED chips 20, a connection pad may be located on the polymer adhesive solution 13 in a connection pad-down state. For example, the micro LED chip 20 may have a size in the range of 10 μm to 100 μm, and may be generally constructed to have a size of tens of μm.

Figure 3B:
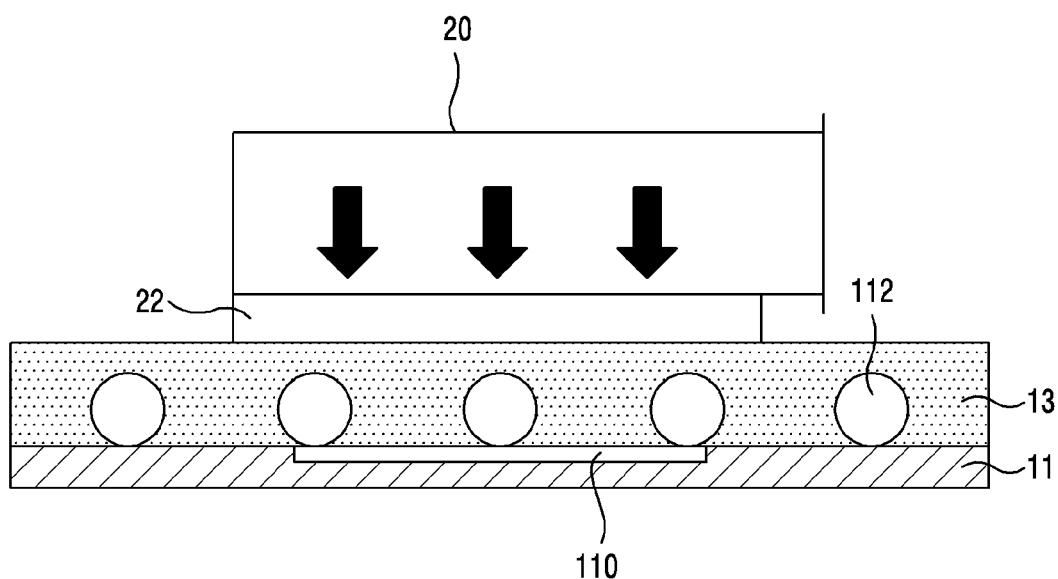

Referring to FIG. 3B, according to an embodiment, the plurality of arrayed micro LED chips 20 may be attached by falling on the coated polymer adhesive solution 13 by their own weight. According to an embodiment, since the viscosity of the liquid polymer adhesive solution 13 is low, the micro LED chip 20 may gradually descend from an upper face of the polymer adhesive solution 13 by its own weight, heating, and pressure.

Figure 3C:
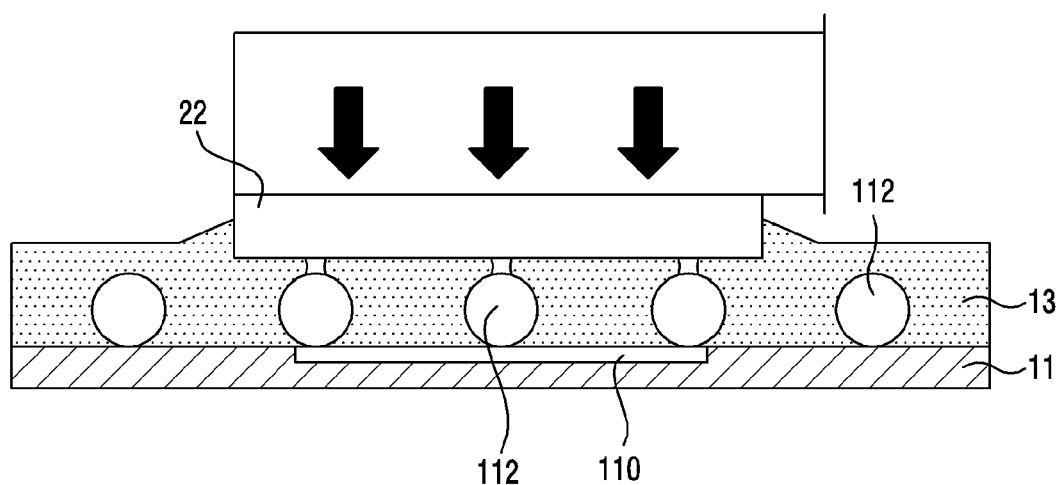

Referring to FIG. 3C, according to an embodiment, the plurality of micro LED chips 20 descending by a first distance may have a space in which the metal particle 112 and a connection pad 22 are partially spaced apart from each other when energy is applied to the polymer adhesive solution 13 by heating (simple heat treatment at a temperature approximately less than or equal to 100° C.) and pressing (low pressure less than or equal to 1 N/m2) in an atmosphere state.

Figure 3D:
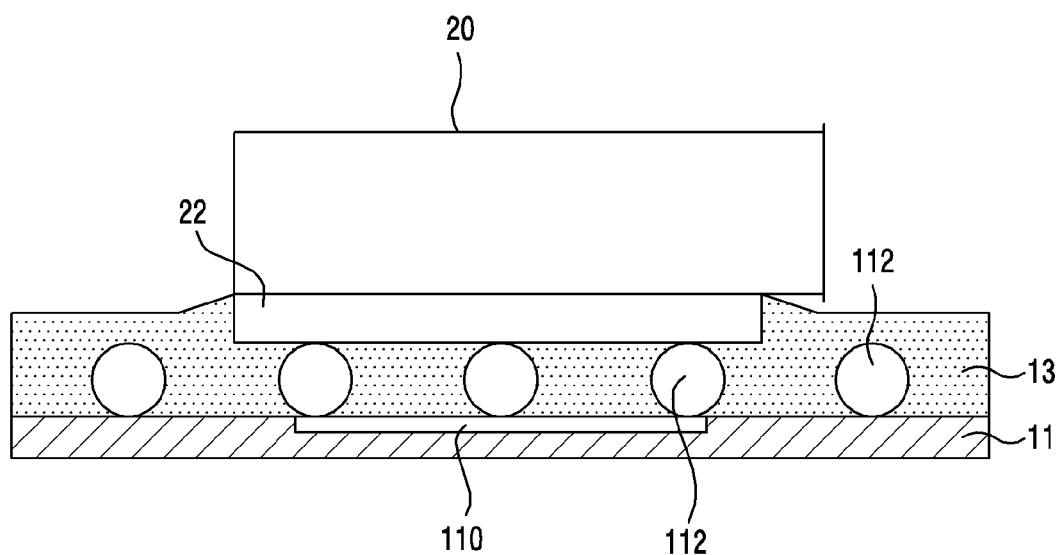

Referring to FIG. 3D, through a continuous heating and pressing process of the polymer adhesive solution 13, the circuit portion 110 of the substrate 11, the metal particle 112, and the connection pad 22 may be physically bonded, that is, electrically connected. According to an embodiment, the UV curable polymer adhesive solution 13 may be used to remove adhesion except for a desired portion. Since a chemical bond is achieved between the circuit portion 110 of the substrate 11 and a pad of an electronic element through the heating and pressing process performed between the substrate 11 and the micro LED chip 20 which are physically connected, a more stable and reliable bonding and conductive structure can be constructed between the micro LED chip 20 and the substrate 11.

The micro LED chip 20 in this state may be cooled through an annealing process in the atmosphere state. After the annealing process, the conductive structure of the micro LED chip 20 for which the chemical bond is achieved may be cured, and the connection pad 22 may be stably electrically connected to the circuit portion 110 through the metal particles 112.

Figure 4:
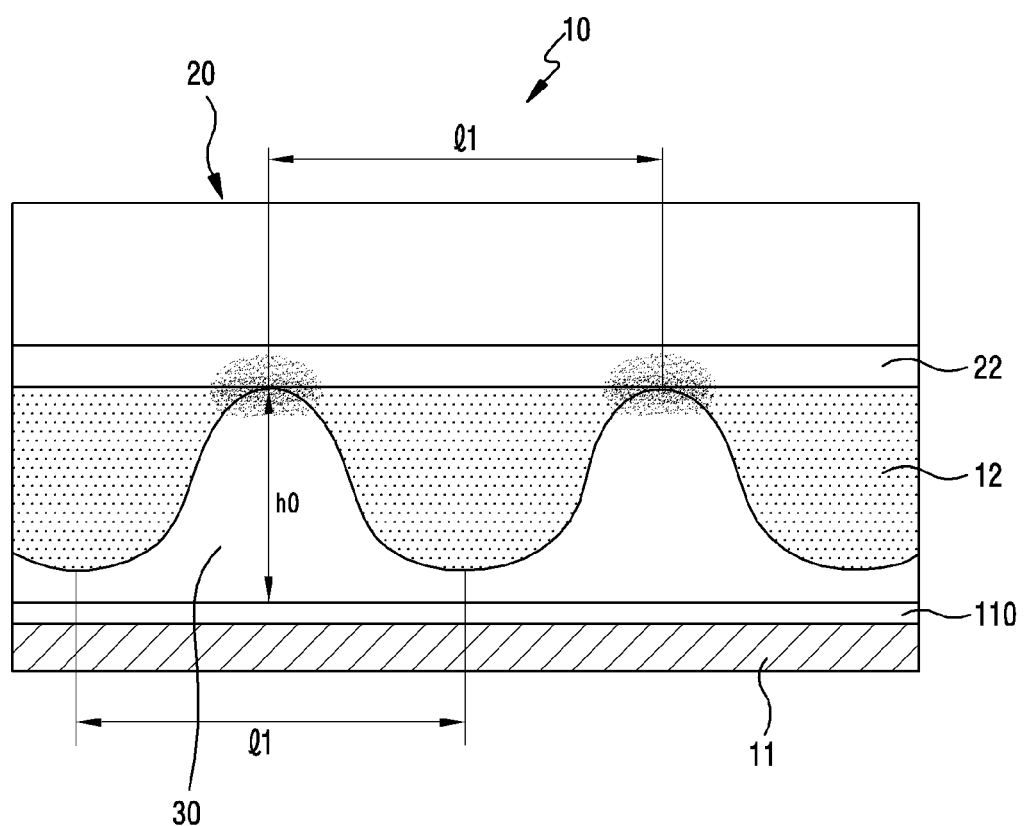
FIG. 4 is a cross-sectional view illustrating a partial structure of a micro LED display according to various embodiments of the disclosure.

FIG. 4 is a cross-sectional view illustrating a partial structure of a micro LED display 10 according to various embodiments of the disclosure.

Referring to FIG. 4, a bonding structure between a micro LED chip 20 and a substrate 11 is different from the bonding structure between the micro LED chip 20 and the substrate 11 shown in FIG. 1 in terms of only a conductive structure between a connection pad 22 and a circuit portion 110, and the remaining structures are identical. Therefore, the identical structure will be omitted to avoid redundancy, and only different structures will be described.

According to an embodiment, the micro LED chip 20 and the circuit portion 110 of the substrate 11 may be electrically connected by a 3-dimensional conductive structure 30. According to an embodiment, the circuit portion 110 may be disposed on one face of the substrate 11, and the 3-dimensional conductive structure 30 may be disposed on one face of the circuit portion 110. According to an embodiment, the 3-dimensional conductive structure 30 may be constructed on the substrate 11 in a layer shape. For example, the 3-dimensional conductive structure 30 may be a plating layer containing a metal element such as indium or gold. According to an embodiment, the 3-dimensional conductive structure 30 may be constructed repeatedly by alternating a ridge portion and a valley portion. For example, the circuit portion 110 may be a TFT circuit.

According to an embodiment, a polymer adhesive layer 12 disposed on the circuit portion 110 of the substrate 11 is a support structure for supporting the plurality of arrayed micro LED chips 20, and may be constructed of an insulating material. According to an embodiment, the polymer adhesive layer 12 is a solution having a low viscosity before being cured, and the plurality of arrayed micro LED chips 20 may descend by a specific distance through heating, pressing, and their own weight and then may be physically in contact with a peak of a ridge portion of the 3-dimentional conductive structure 30. Subsequently, through a cold welding process of forming a metal-metal bond through additional pressing, the arrayed connection pads 22 and the peak may be chemically bonded to construct a stable conductive structure.

According to an embodiment, a height h0 of the 3-dimensional conductive structure 30 may be less than or equal to 5 μm, and a length l1 thereof may be less than or equal to 30 μm. For example, the height h0 of the 3-dimensional conductive structure 30 may be a height from a bottom to the peak of the ridge portion, and the length l1 of the 3-dimensional conductive structure 30 may be a width from the peak of the ridge portion to a next peak of a next adjacent ridge portion. Subsequently, after the cold welding performed between the connection pad 22 and the peak, the connection pad 22 and the peak are chemically bonded to complete a conductive structure and bonding between the micro LED chip 20 and the substrate 11.

FIG. 5A to FIG. 5D are cross-sectional views sequentially illustrating a manufacturing process of a micro LED display according to various embodiments of the disclosure.

A method of manufacturing a micro LED display will be described as follows according to an embodiment with reference to FIG. 5A to FIG. 5D.

Figure 5A:
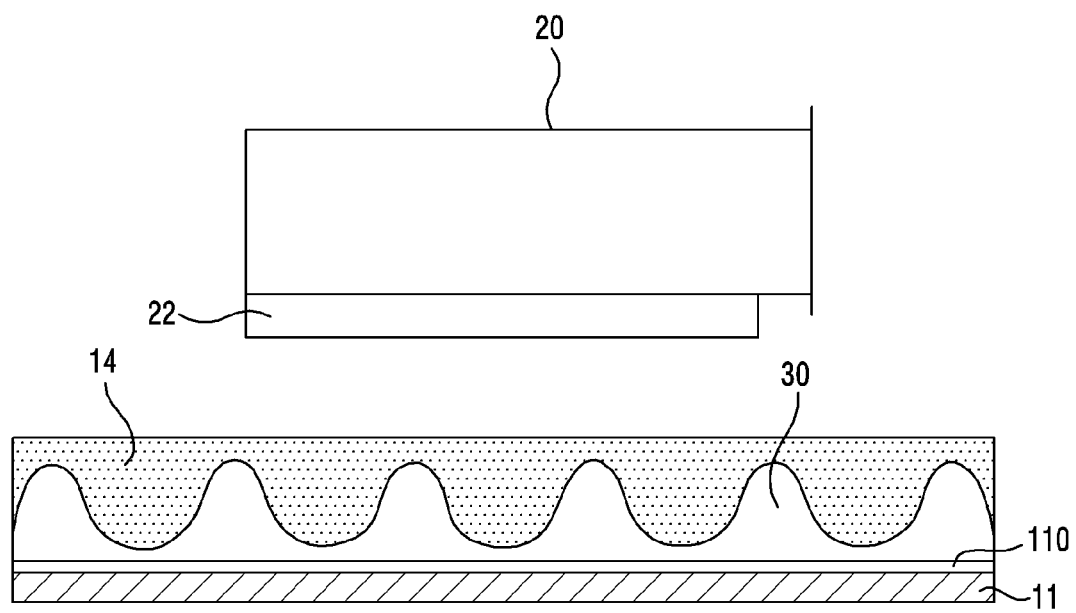
FIGS. 5A to 5D are cross-sectional views sequentially illustrating a manufacturing process of a micro LED display according to various embodiments of the disclosure.

Referring to FIG. 5A, a substrate 11 having a circuit portion constructed on one face thereof may be prepared. A 3-dimensional conductive structure may be constructed on the prepared substrate. According to an embodiment, the 3-dimensional conductive structure may have a convex-concave shape, for example, may have a shape in which a ridge portion and a valley portion are constructed alternately. The ridge portion and the valley portion may be constructed on the circuit portion.

According to an embodiment, after the 3-dimensional conductive structure is constructed on the substrate, a polymer adhesive solution 13 may be coated with a first thickness. For example, the first thickness of the polymer adhesive solution 13 may be in the range of 100 nm to 1000 m. According to an embodiment, in a coating method of the polymer adhesive solution 13, large-area coating may use a spin coating method due to a low viscosity of the adhesive solution 13, and local coating may use a printing or jetting method. For example, the polymer adhesive solution 13 may have an adhesive strength of at least 1 Mn/m2. According to an embodiment, the polymer adhesive solution 13 may contain a UV curing agent. When UV rays are irradiated to the polymer adhesive solution 13, the adhesive strength of the irradiated portion may be removed.

A plurality of micro-sized electronic elements, such as a plurality of micro LED chips 20, prepared on the substrate 11 coated with the polymer adhesive solution 13 may be prepared at a desired position. According to an embodiment, in each of the micro LED chips 20, a connection pad 22 may be located on the polymer adhesive solution 13 in a connection pad-down state. For example, the micro LED chip 20 may have a size in the range of 10 μm to 100 μm, and may be generally constructed to have a size of tens of μm.

Figure 5B:
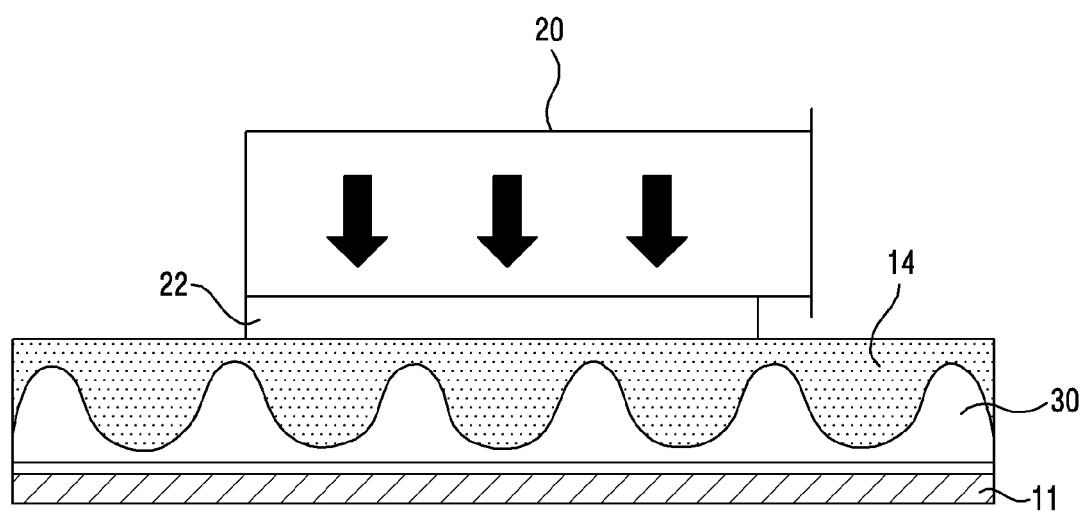

Referring to FIG. 5B, according to an embodiment, the plurality of arrayed micro LED chip 20 may be attached on the coated polymer adhesive solution 13. According to an embodiment, since the viscosity of the liquid polymer adhesive solution 13 is low, the micro LED chip 20 may gradually descend from an upper face of the polymer adhesive solution 13 by its own weight, heating, and pressure.

Figure 5C:
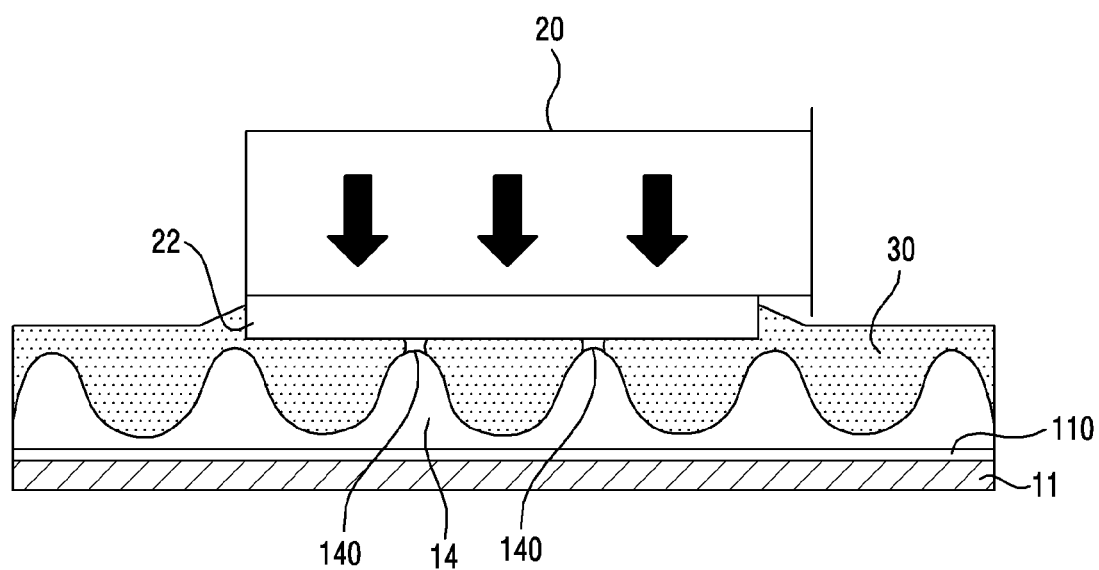

Referring to FIG. 5C, according to an embodiment, the plurality of micro LED chips 20 descending by a first distance may have a space in which a peak 140 and the connection pad 22 are partially spaced apart from each other when energy is applied to the polymer adhesive solution 13 by heating (simple heat treatment at a temperature approximately less than or equal to 100 ° C.) and pressing (low pressure less than or equal to 1N/m2) and thus a distance between the connection pad and a peak of a ridge portion of a 3-dimensional conductive structure 112 reaches within the first distance, in an atmosphere state.

Figure 5D:
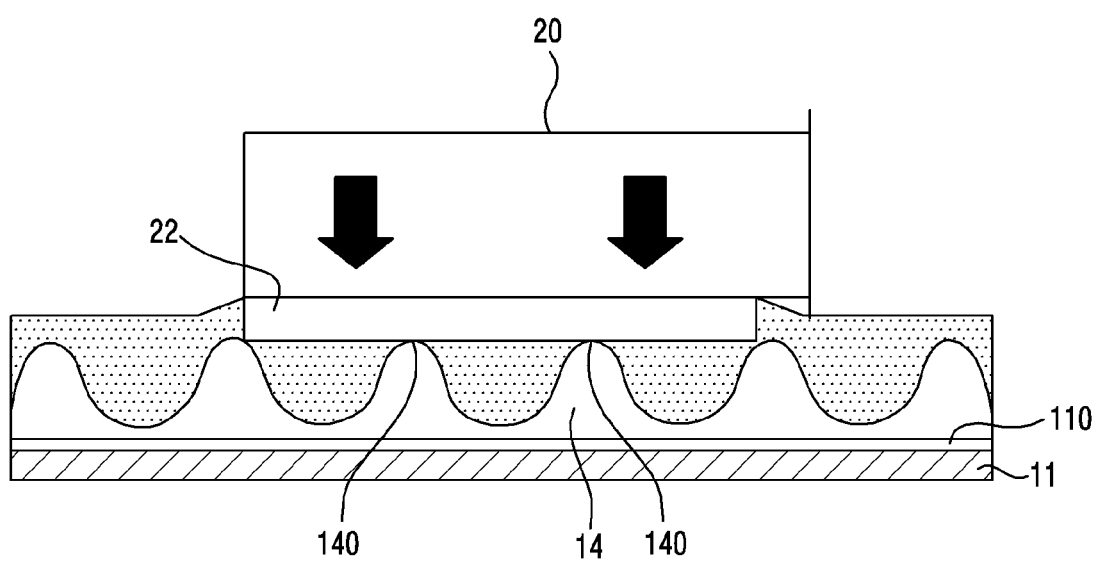

Referring to FIG. 5D, through a continuous heating and pressing process of the polymer adhesive solution 13, the peak 140 of the substrate 11 and the connection pad 22 may be physically in contact. That is, a conductive structure that can be electrically connected may be constructed. Since a chemical bond is achieved through a cold welding process of forming a metal-metal bond between the 3-dimensional conductive structure 112 and the connection pad 22 through an additional pressing process performed between the substrate 11 and the micro LED chip 20 which are physically connected, a more stable and reliable bonding and conductive structure can be constructed between the micro LED chip 20 and the substrate 11.

After the cold welding process, the conductive structure of the micro LED chip 20 for which the chemical bond is achieved may be cured, and the connection pad 22 may be stably electrically connected to the circuit portion 110 through the 3-dimensional conductive structure 112.

FIG. 6A to FIG. 6E are cross-sectional views sequentially illustrating a manufacturing process of a micro LED display according to various embodiments of the disclosure.

A method of manufacturing a micro LED display will be described as follows according to an embodiment with reference to FIG. 6A to FIG. 6E.

Figure 6A:
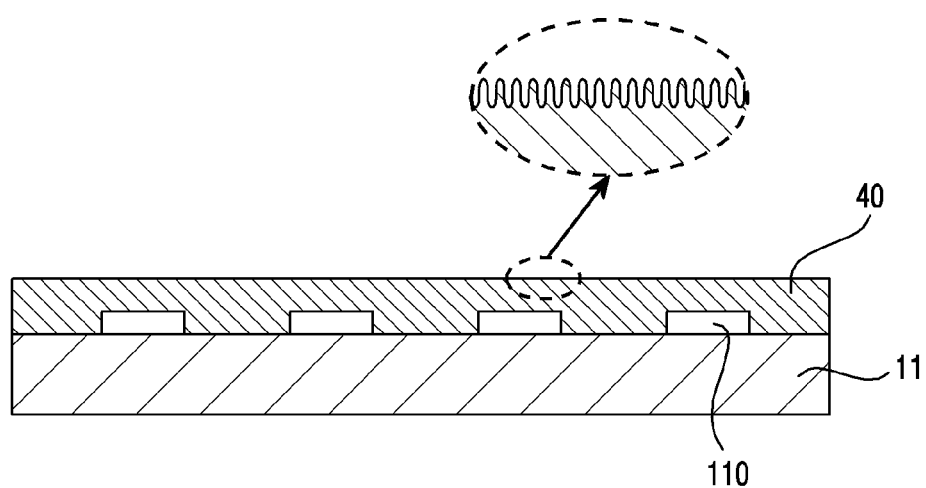
FIGS. 6A to 6E are cross-sectional views sequentially illustrating a manufacturing process of a micro LED display according to various embodiments of the disclosure.

Referring to FIG. 6A, a substrate 11 having a circuit portion 110 constructed on one face may be prepared. According to an embodiment, a plating layer 40 may be constructed on the prepared substrate 11. According to an embodiment, the plating layer 40 may be coated on the substrate 11 with a specific thickness. According to an embodiment, the plating layer 40 may be a 3-dimensional conductive structure. For example, the plating layer 40 may be a conductive layer containing a metal element such as gold. According to an embodiment, the plating layer 40 may have an upper face constructed in such a manner that a concave-convex shape is repeated, for example, by alternating a ridge portion and a valley portion. According to an embodiment, the circuit portion 110 may be a TFT circuit.

Figure 6B:
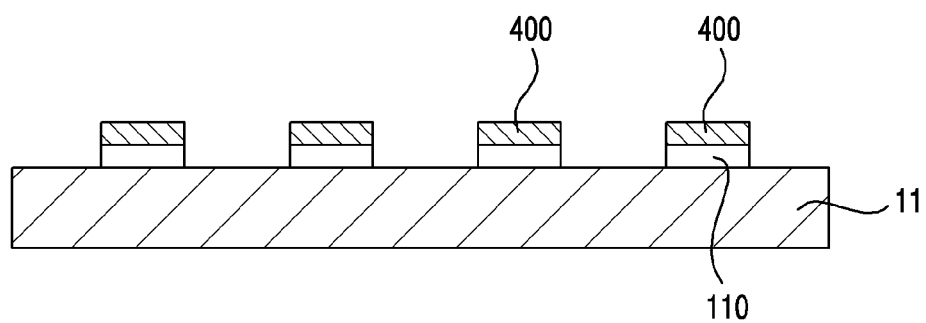

Referring to FIG. 6B, according to an embodiment, after the plating layer 40 is constructed on the substrate 11 in a layer shape, the plating layer 40 may be present only on the circuit portion 110 through a masking and etching process. The plating layer 40 may not be present on a non-circuit portion of the substrate 11. For example, the plating layer disposed only on the circuit portion 110 is denoted by a reference numeral 400.

Figure 6C:
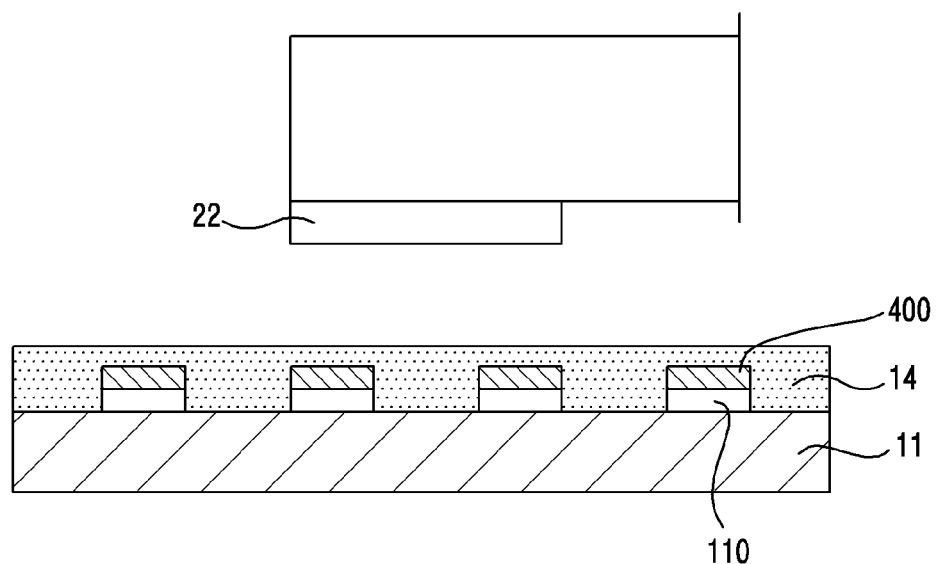
Figure 6D:
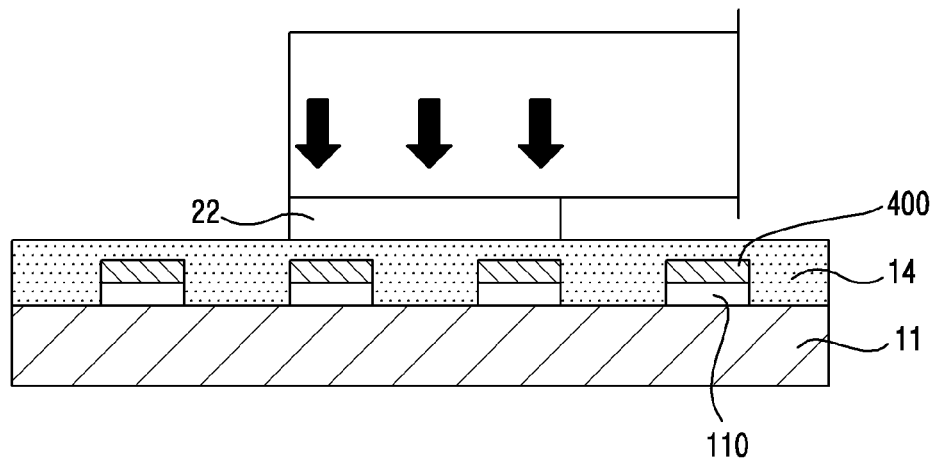

Referring to FIG. 6C, according to an embodiment, a polymer adhesive solution 14 may be coated with a first thickness on the substrate 11 in which the plating layer 400 is constructed on the circuit portion 110. For example, the first thickness of the polymer adhesive solution 14 may be in the range of 100 nm to 1000 m. According to an embodiment, in a coating method of the polymer adhesive solution 14, large-area coating may use a spin coating method due to a low viscosity, and local coating may use a printing or jetting method. For example, the polymer adhesive solution 14 may have an adhesive strength of at least 1 Mn/m2.

A plurality of micro-sized electronic elements, such as a plurality of micro LED chips 20, prepared on the substrate 11 coated with the polymer adhesive solution 14 may be prepared at a desired position. According to an embodiment, in each of the micro LED chips 20, the connection pad 22 may be located on the polymer adhesive solution 14 in a pad-down state. For example, the micro LED chip 20 may have a size in the range of 10 μm to 100 μm, and may be generally constructed to have a size of tens of Referring to FIG. 6D, according to an embodiment, the plurality of arrayed micro LED chips 20 may be attached on the coated polymer adhesive solution 14. According to an embodiment, since the viscosity of the liquid polymer adhesive solution 14 is low, the micro LED chip 20 may gradually descend from an upper face of the polymer adhesive solution 14 by its own weight, heating, and pressure.

According to an embodiment, the plurality of micro LED chips 20 descending by a first distance may have a space in which the upper face of the plating layer 400 and a connection pad 22 are partially spaced apart from each other when energy is applied to the polymer adhesive solution 14 by heating (simple heat treatment at a temperature approximately less than or equal to 100° C.) and pressing (low pressure less than or equal to 1N/m2) in an atmosphere state.

Figure 6E:
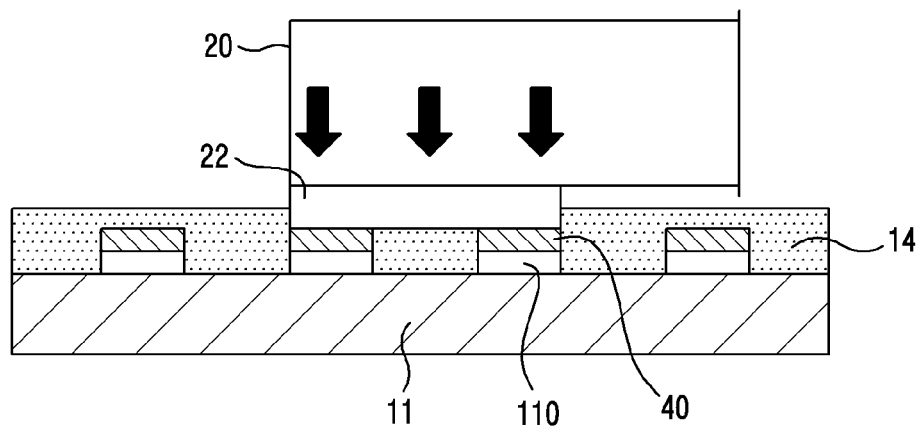

Referring to FIG. 6E, through an additional heating and pressing process of the polymer adhesive solution 14, a conductive structure capable of physically bonding, i.e. electrically connecting, the plating layer 400 and the connection pad 22, may be constructed. Since a chemical bond is achieved between the plating layer 40 and the connection pad 22 through an additional pressing process performed between the substrate 11 and the micro LED chip 20 which are physically connected, a more stable and reliable bonding and conductive structure can be constructed between the micro LED chip 20 and the substrate 11.

Then, after a cold welding process of forming a metal-metal bond through the pressing process of the plating layer 40 and the connection pad 22 of the micro LED chip 20, the conductive structure of the micro LED chip 20 for which the chemical bond is achieved may be cured, and the connection pad 22 may be electrically connected to the circuit portion 110 through the plating layer 400.

Figure 7:
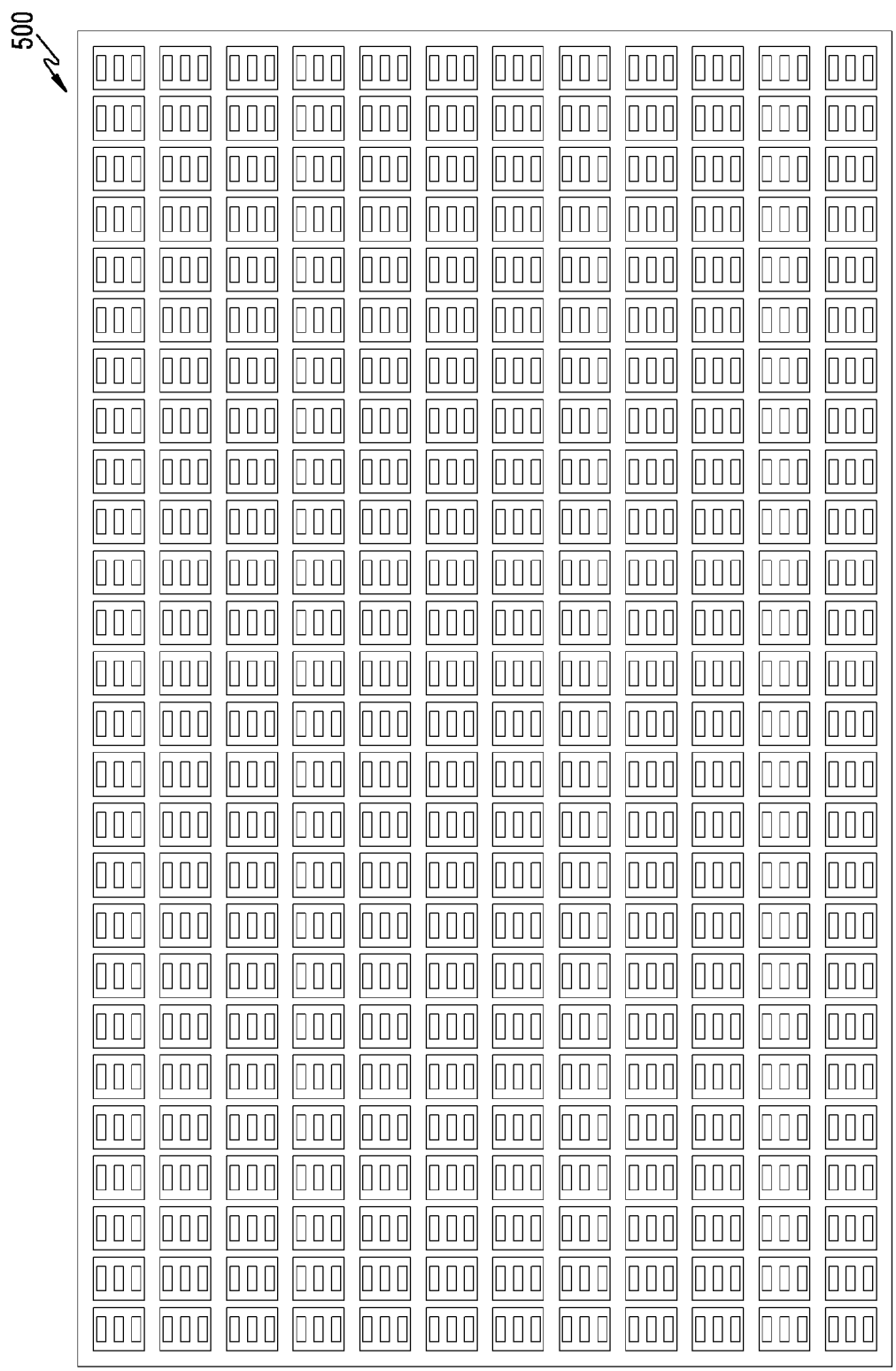
FIG. 7 is a plan view illustrating a display manufactured using a display manufacturing method according to various embodiments of the disclosure.

Referring to FIG. 7, a micro LED display 500 which is componentized may be mounted on a main board to be manufactured as a large-screen display, and may be manufactured as a display of various sizes.

Figure 8:
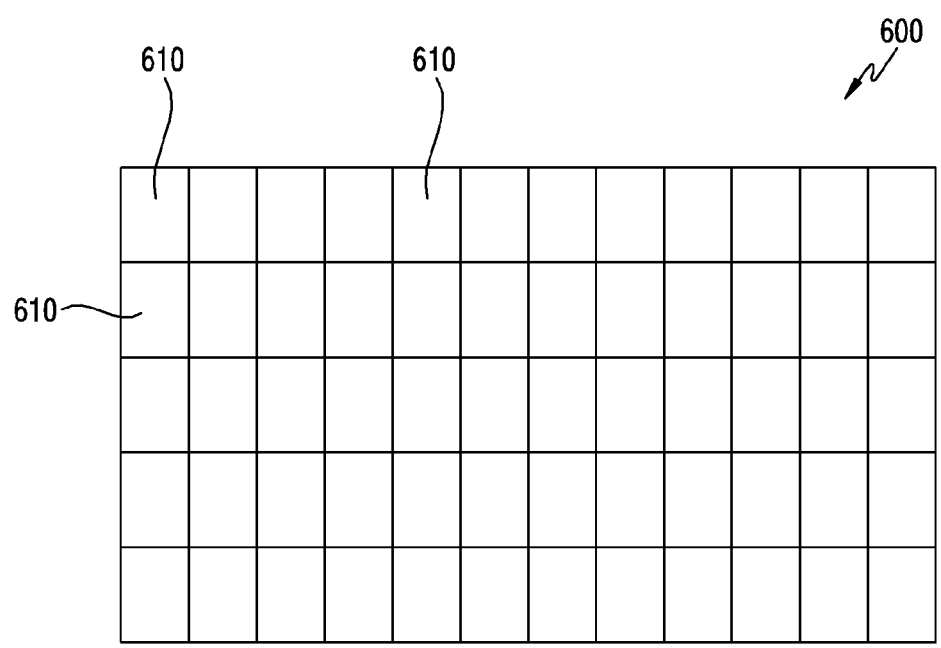
FIG. 8 is a plan view illustrating a large-sized display combined with a micro LED display manufactured using a display manufacturing method according to various embodiments of the disclosure.

FIG. 8 is a plan view illustrating a large-sized display combined with a micro LED display 610 manufactured using a display manufacturing method according to various embodiments of the disclosure.

Referring to FIG. 8, the plurality of micro LED displays 610 manufactured through the manufacturing process of FIG. 3A to FIG. 3D may be assembled to manufacture a micro LED display 600 (e.g., a large TV, a billboard, or the like) with more various widths.

Various embodiments of the disclosure disclosed in the present specification and the drawing are merely a specific example presented for clarity and are not intended to limit the scope of the embodiments of the present disclosure. Therefore, in addition to the embodiments disclosed herein, various changes in forms and details made without departing from the technical concept of the various embodiments of the disclosure will be construed as being included in the scope of the various embodiments of the present disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. A method for manufacturing a micro Light Emitting Diode (LED) display, the method comprising:

coating a face of a substrate including a circuit portion with a first thickness of a polymer adhesive solution containing a plurality of metal particles;

attaching an array of micro LED chips on the polymer adhesive solution;

forming a space between a connection pad for each of the array of micro LED chips and the plurality of metal particles through heating and pressing applied to the polymer adhesive solution;

physically connecting the connection pad for each of the array of micro LED chips to the metal particles by the heating and the pressing the attached array of micro LED chips to descend through the polymer adhesive solution; and chemically bonding the metal particles to the connection pad and the circuit portion by the heating and the pressing so that the micro LED chips are electrically connected to the circuit portion, wherein the chemically bonding comprises forming an alloy formed by bonding of a portion of the plurality of metal particles with the circuit portion.

2. The method of claim 1, wherein the substrate is constructed of a glass material.

3. The method of claim 1, wherein each of the metal particles has a size in a range of 50 nm to 500 nm.

4. The method of claim 1, wherein metal particles of the plurality of metal particles are alloyed with a metal material of the circuit portion at a temperature in a range of 50° C. to 300° C.

5. The method of claim 1, wherein in the physically connecting, a physical bond is formed between metal particles of the plurality of metal particles and the connection pad of the micro LED chip by performing heat treatment at a temperature less than or equal to 100° C. or by applying a pressure less than or equal to $1N/m^2$.

6. The method of claim 1, wherein the circuit portion includes a TFT circuit.

7. A micro LED display comprising:

a substrate including a circuit portion at one face;

an array of micro LED chips attached on a polymer adhesive layer;

a 3-dimensional conductive structure disposed on a one face of the circuit portion and comprising a ridge portion and a valley portion formed to be alternately; and a polymer adhesive layer supporting the micro LED chips and disposed between the valley portion and a connection pad of the micro LED chips, and wherein the connection pad of the micro LED chips and a peak of the ridge portion are chemically bonded.

8. The micro LED display of claim 7, wherein the substrate is constructed of a glass material.

9. The micro LED display of claim 7, wherein each of the micro LED chips is disposed in a connection pad-down type.

10. The method of claim 1, wherein the array of micro LED chips includes a first portion located in the polymer adhesive solution and a second portion located outside the polymer adhesive solution.

11. The method of claim 10, wherein the first portion occupies less than or equal to 10%, and the second portion occupies greater than or equal to 90%.

12. The method of claim 10, wherein, when the substrate is constructed of a glass material, the first portion occupies less than or equal to 50% for each respective micro LED chip, and the second portion occupies greater than or equal to 50% for each respective micro LED chip.

13. The method of claim 1, wherein each of the micro LED chips is disposed in a connection pad-down type.

14. The micro LED display of claim 7, wherein the circuit portion includes a TFT circuit.

* * * * *